(12) United States Patent
Fukami et al.

(10) Patent No.: US 11,081,814 B2
(45) Date of Patent: Aug. 3, 2021

(54) WIRING MODULE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Yuuya Fukami, Mie (JP); Shinya Itou, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 176 days.

(21) Appl. No.: 16/344,280

(22) PCT Filed: Jul. 4, 2017

(86) PCT No.: PCT/JP2017/024467
§ 371 (c)(1),
(2) Date: Apr. 23, 2019

(87) PCT Pub. No.: WO2018/078954
PCT Pub. Date: May 3, 2018

(65) Prior Publication Data
US 2019/0273329 A1      Sep. 5, 2019

(30) Foreign Application Priority Data
Oct. 31, 2016   (JP) .............................. JP2016-212661

(51) Int. Cl.
*H01R 4/58*   (2006.01)
*B60R 16/02*  (2006.01)
(Continued)

(52) U.S. Cl.
CPC ............... *H01R 4/58* (2013.01); *B60R 16/02* (2013.01); *B60R 16/0207* (2013.01);
(Continued)

(58) Field of Classification Search
CPC ...... H01R 33/00; H01R 9/2441; H02H 7/261; H01M 2/206
See application file for complete search history.

(56) References Cited

U.S. PATENT DOCUMENTS 1,772,947 A * 8/1930 Hoffmann .............. H01B 17/46
174/141 R
1,880,259 A * 10/1932 Knapp ................. H01B 17/005
174/141 R
(Continued)

FOREIGN PATENT DOCUMENTS

JP   H10-021816 A    1/1998
JP   2014-220900 A   11/2014

OTHER PUBLICATIONS

International Search Report, Application No. PCT/JP2017/024467, dated Sep. 26, 2017. ISA/Japan Patent Office.

*Primary Examiner* — William H. Mayo, III
*Assistant Examiner* — Krystal Robinson
(74) *Attorney, Agent, or Firm* — Honigman LLP (57) ABSTRACT

Provided is a wiring module with a reduced weight. The wiring module is a vehicle-mounted wiring module that includes a conductor plate formed from a conductor that supplies power from an electricity storage device to an electric device. The wiring module includes a flat, conductive first conductor plate, a flat, conductive second conductor plate, and a conductive first coupling member. The first conductor plate has a first cross-sectional area. The second conductor plate has a second cross-sectional area smaller than the first cross-sectional area is, and is to be connected (Continued)

to the first conductor plate. The first coupling member couples the first conductor plate and the second conductor plate to each other.

14 Claims, 6 Drawing Sheets

(51) Int. Cl.
| | |
|---|---|
| H01B 7/00 | (2006.01) |
| H02G 3/36 | (2006.01) |
| H05K 7/02 | (2006.01) |
| H01R 4/30 | (2006.01) |
| H01R 25/16 | (2006.01) |

(52) U.S. Cl.
CPC ............ *H01B 7/0045* (2013.01); *H01R 4/30* (2013.01); *H01R 25/16* (2013.01); *H02G 3/36* (2013.01); *H05K 7/02* (2013.01); *H01R 2201/26* (2013.01)

(56) References Cited

U.S. PATENT DOCUMENTS

| | | | | | |
|---|---|---|---|---|---|
| 1,940,591 | A * | 12/1933 | Hawley | ................. | H01B 17/46 |
| | | | | | 174/141 R |
| 2,099,540 | A * | 11/1937 | Smith | .................... | H01B 17/00 |
| | | | | | 174/139 |
| 2,458,804 | A * | 1/1949 | Sundt | .................... | H01H 73/24 |
| | | | | | 337/76 |
| 3,335,328 | A * | 8/1967 | Brackett | ............... | H01L 23/315 |
| | | | | | 361/806 |
| 3,707,652 | A * | 12/1972 | Coffey | .................... | H02B 1/21 |
| | | | | | 361/648 |
| 3,713,072 | A * | 1/1973 | Henschen | ............ | H01R 4/2495 |
| | | | | | 439/425 |
| 3,949,340 | A * | 4/1976 | Humphreys | ....... | H01H 85/0456 |
| | | | | | 337/159 |
| 4,008,365 | A * | 2/1977 | Carlson | ................. | H02G 5/007 |
| | | | | | 174/68.2 |
| 4,008,366 | A * | 2/1977 | Geyer | .................... | H02G 5/002 |
| | | | | | 174/88 B |
| 4,213,003 | A * | 7/1980 | Carlson | ................. | H02G 5/007 |
| | | | | | 174/68.2 |
| 4,236,778 | A * | 12/1980 | Hughes | .................... | H01R 9/24 |
| | | | | | 439/406 |
| 4,833,278 | A * | 5/1989 | Lambeth | .............. | H01B 17/525 |
| | | | | | 174/139 |
| 4,866,503 | A * | 9/1989 | Kushibiki | ........... | H01L 23/4006 |
| | | | | | 257/665 |
| 4,927,384 | A * | 5/1990 | Bates | .................... | H01R 12/613 |
| | | | | | 439/422 |
| 5,023,406 | A * | 6/1991 | Thornley | .............. | H01B 17/42 |
| | | | | | 174/209 |
| 5,203,724 | A * | 4/1993 | Casey | ...................... | H01R 9/24 |
| | | | | | 439/521 |
| 5,328,392 | A * | 7/1994 | Lin | ...................... | H01H 85/203 |
| | | | | | 439/620.27 |
| 5,383,800 | A | 1/1995 | Saka et al. | | |
| 5,446,242 | A * | 8/1995 | Barrett | .................. | H01B 17/14 |
| | | | | | 174/137 R |
| 5,543,581 | A * | 8/1996 | Kurata | ................. | H01R 13/514 |
| | | | | | 307/9.1 |
| 5,587,652 | A * | 12/1996 | Berkcan | ............... | G01R 15/185 |
| | | | | | 324/126 |
| 5,594,403 | A * | 1/1997 | Taga | ....................... | H01H 85/20 |
| | | | | | 337/186 |
| 5,637,831 | A * | 6/1997 | Lambeth | ................ | H01B 17/42 |
| | | | | | 174/209 |
| 5,645,448 | A * | 7/1997 | Hill | ...................... | H01R 11/287 |
| | | | | | 439/522 |
| 5,816,850 | A * | 10/1998 | Yamada | ................. | H01R 9/245 |
| | | | | | 439/507 |
| 5,831,425 | A * | 11/1998 | Ochiai | ............... | G01R 19/0092 |
| | | | | | 324/117 R |
| 5,871,858 | A * | 2/1999 | Thomsen | .............. | B60R 25/045 |
| | | | | | 429/7 |
| 6,030,257 | A * | 2/2000 | Furuya | ................ | H01H 85/2045 |
| | | | | | 439/620.26 |
| 6,109,928 | A * | 8/2000 | Morris | ........................ | B41J 2/45 |
| | | | | | 439/67 |
| 6,157,288 | A * | 12/2000 | Yamaguchi | ............ | H01H 37/76 |
| | | | | | 337/182 |
| 6,294,978 | B1 * | 9/2001 | Endo | ..................... | H01H 85/044 |
| | | | | | 337/159 |
| 6,325,640 | B1 * | 12/2001 | Kasai | .................. | H01R 25/168 |
| | | | | | 174/71 B |
| 6,448,882 | B1 * | 9/2002 | Inaba | ................... | H01H 85/044 |
| | | | | | 337/159 |
| 6,515,468 | B1 * | 2/2003 | Morimoto | ............ | G01R 15/207 |
| | | | | | 324/117 H |
| 6,551,147 | B2 * | 4/2003 | Wakata | ................ | H01R 11/287 |
| | | | | | 439/754 |
| 6,570,088 | B1 * | 5/2003 | Depp | .................... | B60R 16/0238 |
| | | | | | 174/50 |
| 6,614,203 | B2 * | 9/2003 | Yuasa | ................. | B60R 16/0238 |
| | | | | | 320/104 |
| 7,033,186 | B2 * | 4/2006 | Kawakita | .................. | H05K 7/026 |
| | | | | | 439/76.2 |
| 7,118,400 | B1 * | 10/2006 | Lopez | .................. | H01R 9/2441 |
| | | | | | 439/170 |
| 7,223,129 | B1 * | 5/2007 | Lopez | ...................... | H01R 9/24 |
| | | | | | 174/59 |
| 7,381,101 | B2 * | 6/2008 | Roset | .................... | G01R 31/364 |
| | | | | | 439/754 |
| 7,458,705 | B2 * | 12/2008 | Chiba | .................. | B60Q 1/2696 |
| | | | | | 362/362 |
| 7,722,372 | B2 * | 5/2010 | Matsumoto | ........... | H02M 7/003 |
| | | | | | 439/213 |
| 7,811,116 | B2 * | 10/2010 | Sakakura | ................ | H01R 11/12 |
| | | | | | 439/364 |
| 7,928,827 | B2 * | 4/2011 | Urrea | ..................... | H01H 85/08 |
| | | | | | 337/161 |
| 8,142,234 | B2 * | 3/2012 | Kaneshiro | .............. | H01R 4/302 |
| | | | | | 439/709 |
| 8,142,237 | B2 * | 3/2012 | Condamin | ........... | G01R 31/364 |
| | | | | | 439/762 |
| 8,226,446 | B2 * | 7/2012 | Kondo | ................ | H01R 9/2475 |
| | | | | | 439/719 |
| 8,299,360 | B2 * | 10/2012 | Sato | ....................... | H01R 25/00 |
| | | | | | 174/68.2 |
| 8,425,256 | B2 * | 4/2013 | Aoki | ..................... | H01R 13/688 |
| | | | | | 439/620.26 |
| 8,476,864 | B2 * | 7/2013 | Ferre Fabregas | ... | H01M 10/486 |
| | | | | | 320/104 |
| 8,721,367 | B2 * | 5/2014 | Matsumoto | .......... | H01H 85/175 |
| | | | | | 439/620.26 |
| 9,070,989 | B2 * | 6/2015 | Yasui | .................... | H01R 11/283 |
| 9,306,379 | B2 * | 4/2016 | Greenberg | ............... | H02G 3/08 |
| 9,564,706 | B2 * | 2/2017 | Ozawa | ................ | H01R 13/521 |
| 9,698,543 | B2 * | 7/2017 | Kato | ................. | H01R 13/688 |
| 9,768,600 | B1 * | 9/2017 | Kato | ................. | H01R 13/688 |
| 9,787,071 | B1 * | 10/2017 | Rauckman | ............ | H02G 3/081 |
| 9,941,610 | B1 * | 4/2018 | Hai | ........................ | H01R 9/245 |
| 10,056,723 | B2 * | 8/2018 | Pal | ........................ | H01R 11/09 |
| 10,217,593 | B2 * | 2/2019 | Bougeard | .............. | H01H 85/54 |
| 10,611,321 | B2 * | 4/2020 | Hida | ......................... | B60R 16/03 |
| 10,720,286 | B1 * | 7/2020 | Mickler | ............... | H01H 85/2015 |
| 10,862,229 | B2 * | 12/2020 | Yamane | ........... | H01R 13/62933 |
| 2002/0123267 | A1 * | 9/2002 | Brooks | .................. | H01R 13/68 |
| | | | | | 439/620.33 |
| 2003/0008534 | A1 * | 1/2003 | Welschholz | ........... | H01R 12/61 |
| | | | | | 439/34 |
| 2005/0217982 | A1 * | 10/2005 | Chen | ..................... | H01R 31/02 |
| | | | | | 200/1 R |
| 2005/0237722 | A1 * | 10/2005 | Hable | ................. | H01L 23/4334 |
| | | | | | 361/728 |
| 2006/0178034 | A1 * | 8/2006 | Shimirak | ............... | H01R 4/2429 |
| | | | | | 439/397 |

(56) References Cited

U.S. PATENT DOCUMENTS

| | | | |
|---|---|---|---|
| 2007/0105427 A1* | 5/2007 | Mori | H01R 11/03 |
| | | | 439/364 |
| 2010/0328018 A1* | 12/2010 | Matsumoto | H01H 85/0417 |
| | | | 337/187 |
| 2011/0065310 A1* | 3/2011 | Kondo | H01R 11/07 |
| | | | 439/488 |
| 2011/0117792 A1* | 5/2011 | Kaneshiro | H01R 9/24 |
| | | | 439/709 |
| 2011/0248858 A1* | 10/2011 | Onodi | H02H 7/261 |
| | | | 340/635 |
| 2012/0080939 A1* | 4/2012 | Shimowake | H01R 9/24 |
| | | | 307/11 |
| 2012/0190251 A1* | 7/2012 | Akuta | H01R 4/34 |
| | | | 439/722 |
| 2012/0222726 A1* | 9/2012 | Qin | H01L 31/02008 |
| | | | 136/251 |
| 2013/0009744 A1* | 1/2013 | Douglass | H01H 85/15 |
| | | | 337/187 |
| 2013/0269746 A1* | 10/2013 | Ramsey | H01L 31/05 |
| | | | 136/244 |
| 2013/0293341 A1* | 11/2013 | Krause | H01H 85/47 |
| | | | 337/187 |
| 2016/0204555 A1* | 7/2016 | Sueyoshi | H01M 50/581 |
| | | | 439/620.26 |
| 2017/0004945 A1* | 1/2017 | Fuessl | H01R 13/68 |
| 2017/0214199 A1* | 7/2017 | Masel | H01R 13/447 |
| 2017/0250510 A1* | 8/2017 | Niedermeier | H01R 4/70 |
| 2017/0278662 A1* | 9/2017 | Kitano | H01H 85/0241 |
| 2017/0355327 A1 | 12/2017 | Hida et al. | |
| 2018/0001849 A1* | 1/2018 | Abe | B60R 16/0215 |
| 2019/0259991 A1* | 8/2019 | Ligabue | H01M 10/6555 |

\* cited by examiner

WIRING MODULE

CROSS-REFERENCE TO RELATED APPLICATIONS

This application is the U.S. national stage of PCT/JP2017/024467 filed Jul. 4, 2017, which claims priority of Japanese Patent Application No. JP 2016-212661 filed Oct. 31, 2016, the contents of which are incorporated herein.

TECHNICAL FIELD

The present disclosure relates to a wiring module.

BACKGROUND

JP 2016-120901A describes an automobile power supply device. The automobile power supply device is provided with a battery and two metal wires. The battery is installed in an engine room of the body of a vehicle, for example. The two metal wires have a plate shape, and are connected to the positive terminal and the negative terminal, respectively, of the battery. These metal wires extend from the engine room into the compartment of the vehicle.

The vehicle body is provided with a plurality of electric devices. This plurality of electric devices is connected to the positions nearest to the metal wires via wire harnesses. This allows power to be supplied from the battery to the electric devices.

Note that JP 2012-206616A is given as an exemplary citation that discloses a technique relating to the present disclosure.

Power can be appropriately supplied to all the electric devices by designing the sizes of the metal wires for supplying power to the plurality of electric devices such that they match the sum of the maximum values of the currents flowing through the respective electric devices. However, when the sizes of the wires are designed simply to match the sum of the maximum values of the currents, the cross-sectional areas of the wires are unduly increased, thus increasing the overall weight of the wires. Also, the larger the weight of the objects installed on the vehicle, the poorer the fuel efficiency is. That is, when the sizes of the wires are designed to match the sum of the maximum values of the currents, the wires become heavy, thus reducing the fuel efficiency.

Therefore, it is an object of the present disclosure to provide a wiring module with a reduced weight.

SUMMARY

A first aspect of a wiring module is a vehicle-mounted wiring module that includes a conductor plate formed from a flat conductor that supplies power from an electricity storage device to an electric device. The wiring module includes a flat, a conductive first conductor plate, a flat, conductive second conductor plate, and a conductive first coupling member. The first conductor plate has a first cross-sectional area. The second conductor plate has a second cross-sectional area smaller than the first cross-sectional area is, and is to be connected to the first conductor plate. The first coupling member couples the first conductor plate and the second conductor plate to each other.

A second aspect of a wiring module is the wiring module according to the first aspect, wherein the second conductor plate has a cross-sectional width smaller than a cross-sectional width of the first conductor plate.

A third aspect of a wiring module is the wiring module according to the first aspect, wherein the second conductor plate has a thickness smaller than a thickness of the first conductor plate.

A fourth aspect of a wiring module is the wiring module according to any one of the first to third aspects, wherein the first coupling member includes a conductive first overcurrent protection portion. The first overcurrent protection portion is interposed between the first conductor plate and the second conductor plate, and is rendered non-conductive by a current that exceeds a first allowable current flowing therethrough.

A fifth aspect of a wiring module is the wiring module according to any one of the first to fourth aspects, further including a wire. The wire is branched from the first conductor plate. For example, the wire is a flat conductor.

A sixth aspect of a wiring module is the wiring module according to the fourth aspect, further including a flat third conductor plate, and a conductive second coupling member. The third conductor plate has a third cross-sectional area smaller than the second cross-sectional area, and is connected to the first conductor plate via the second conductor plate. The second coupling member couples the second conductor plate and the third conductor plate to each other. The second coupling member includes a conductive second overcurrent protection portion. The second overcurrent protection portion is rendered non-conductive by a current that exceeds a second allowable current smaller than the first allowable current flowing therethrough.

A seventh aspect of a wiring module is the wiring module according to the fourth aspect, wherein the first coupling member includes an insulating support, a first conductor, a second conductor, a first fixing portion, and a second fixing portion. The first conductor is mounted to the support. The second conductor is spaced apart from the first conductor, and mounted to the support. The first fixing portion is provided extending through the first conductor. The second fixing portion is provided extending through the second conductor. The first conductor plate and the first conductor are fixed to the first fixing portion, and the second conductor plate and the second conductor are fixed to the second fixing portion.

An eighth aspect of a wiring module is the wiring module according to the seventh aspect, wherein the first fixing portion and the second fixing portion are a bolt and a nut, respectively.

Advantageous Effects of Disclosure

With the wiring module, it it possible to route conventional metal wires in a divided manner, thus routing the wires such that appropriate currents flow through the divided metal wires (the first conductor plate, the second conductor plate, etc.). This makes it possible to appropriately route the metal wires according to the power required by the vehicle without providing any metal wire having an unduly large cross-sectional area, thus reducing the weight of the wiring module.

DETAILED DESCRIPTION OF PREFERRED EMBODIMENTS

System

Figure 1:
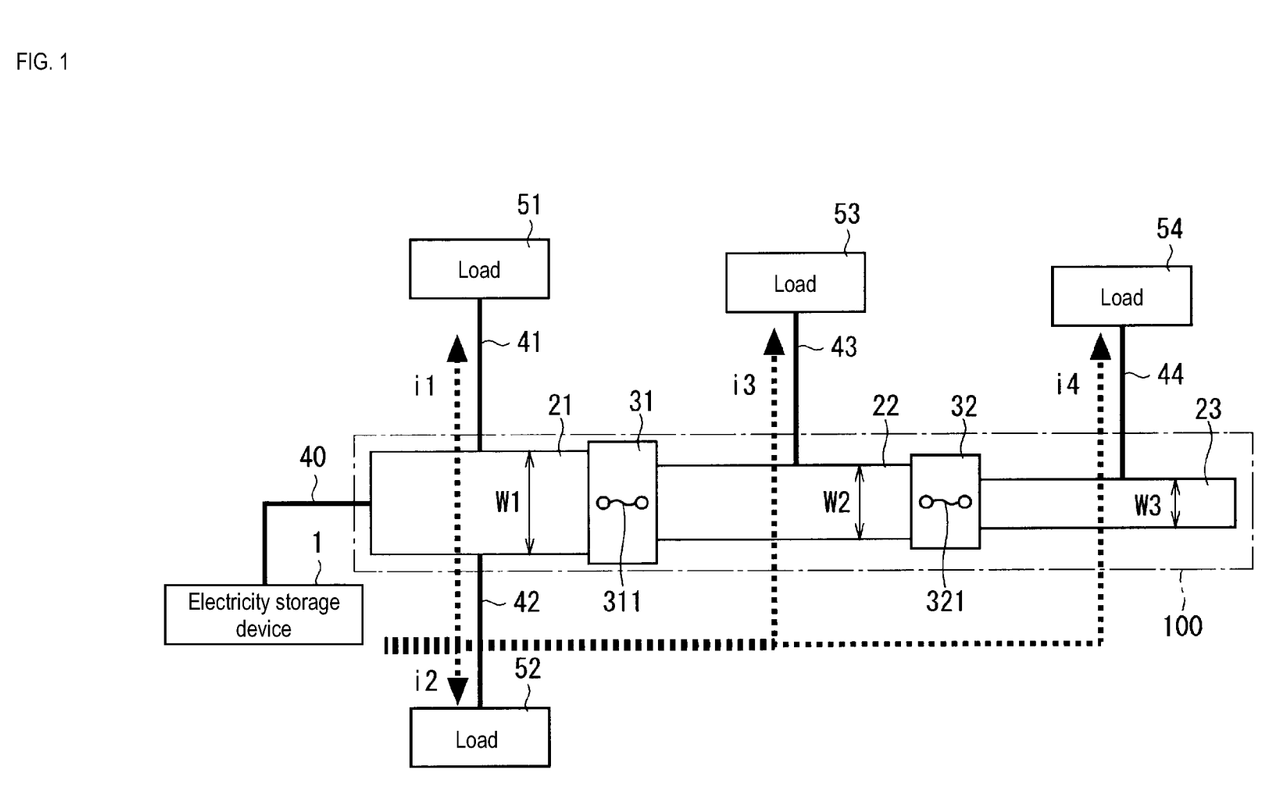
FIG. 1 is a diagram schematically showing an example of the configuration of a vehicle-mounted power supply system.

FIG. 1 is a diagram schematically showing an example of the configuration of a vehicle-mounted power supply system. The power supply system is installed in a vehicle (e.g., an automobile). Also, the power supply system includes an electricity storage device 1, a vehicle-mounted wiring module 100, wires 40 to 44, and loads 51 to 54. The wiring module 100 includes conductor plates 21 to 23 and coupling members 31 and 32.

Each of the conductor plates 21 to 23 has a plate shape. Specifically, each of the conductor plates 21 to 23 is formed by a single conductor, has a long shape that is longer in the longitudinal direction, and has a flat shape on a cross section perpendicular to the longitudinal direction thereof (hereinafter also referred to as a "module cross section"). For example, each of the conductor plates 21 to 23 may have a rectangular shape on the module cross section (see also FIG. 2). The module cross section as used herein is a cross section for a portion having conductivity. For example, when the conductor plates 21 to 23 are covered with an insulating covering, the insulating covering is not included in the cross section.

Each of the conductor plates 21 to 23 is made of a conductive material, and may be made of a metal, for example. For example, a metal such as copper, a copper alloy, aluminum, or an aluminum alloy may be used as the material of the conductor plates 21 to 23. The conductor plates 21 to 23 can function as wires used for supplying power to the loads 51 to 54.

The cross-sectional areas of the conductor plates 21 to 23 on the module cross section are different from each other. For example, the cross-sectional area of the conductor plate 23 is smaller than the cross-sectional area of the conductor plate 22, and the cross-sectional area of the conductor plate 22 is smaller than the cross-sectional area of the conductor plate 21. In the example shown in FIG. 1, cross-sectional widths W1 to W3 of the conductor plates 21 to 23 (widths extending along a direction perpendicular to both the longitudinal and thickness directions thereof, hereinafter also referred to as "width direction") are different from each other. For example, the width W3 of the conductor plate 23 is smaller than the width W2 of the conductor plate 22, and the width W2 of the conductor plate 22 is smaller than the width W1 of the conductor plate 21. Accordingly, it is possible to establish the magnitude relationship between the cross-sectional areas, while setting the thicknesses of the conductor plates 21 to 23 to be substantially the same.

The conductor plates 21 and 22 are connected to each other via a coupling member 31, for example. The coupling member 31 has conductivity, and mechanically couples the conductor plates 21 and 22, while electrically connecting the conductor plates 21 and 22. In the example shown in FIG. 1, one end of the conductor plate 21 in the longitudinal direction is coupled to the coupling member 31, and one end of the conductor plate 22 in the longitudinal direction is coupled to the coupling member 31. The longitudinal directions of the conductor plates 21 and 22 are substantially the same, for example.

The coupling member 31 may include an overcurrent protection portion 311. The overcurrent protection portion 311 is interposed between the conductor plates 21 and 22, and is rendered non-conductive by a current that exceeds a predetermined allowable current (hereinafter referred to as a "first allowable current") flowing therethrough. The overcurrent protection portion 311 may be a fuse, for example.

Figure 2:
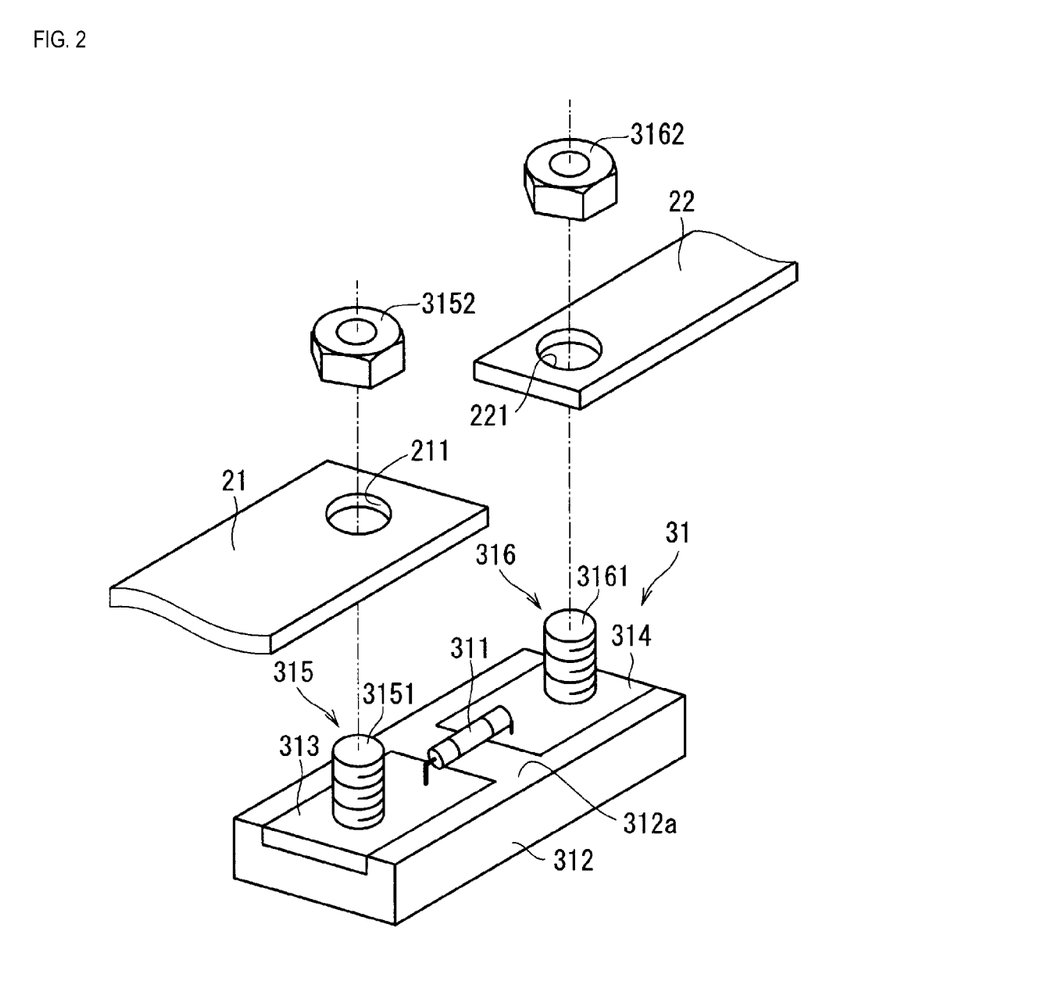
FIG. 2 is an exploded perspective view schematically showing an example of the configuration of a coupling member.

FIG. 2 is an exploded perspective view schematically showing an example of the specific configuration of the coupling member 31. For example, the coupling member 31 includes a support 312, conductors 313 and 314, an overcurrent protection portion 311, and fixing portions 315 and 316.

The support 312 is made of, for example, an insulating material (e.g., a resin), and has the shape of a substantially rectangular solid, for example. The conductors 313 and 314 are mounted on one surface 312a of the support 312. The conductors 313 and 314 are made of a conductive material, and are formed in a plate shape, for example. For example, the conductors 313 and 314 are disposed in an orientation in which the thickness directions thereof extend along the normal direction of the surface 312a. In addition, the conductors 313 and 314 are spaced apart from each other. For example, the conductors 313 and 314 are spaced apart from each other in a direction parallel to the surface 312a.

The overcurrent protection portion 311 is provided between the conductors 313 and 314. That is, one end of the overcurrent protection portion 311 is connected to the conductor 313, and the other end thereof is connected to the conductor 314. The method for fixing the overcurrent protection portion 311 to each of the conductors 313 and 314 is not particularly limited, and it is possible to use, for example, a fixing method such as soldering.

The conductor 313 is provided with the fixing portion 315. The fixing portion 315 fixes the conductor plate 21 to the conductor 313. The fixing portion 315 includes a bolt portion 3151 and a nut 3152. The bolt portion 3151 is provided upright on the conductor 313. The bolt portion 3151 has a substantially columnar shape, and extends from the conductor 313 toward the opposite side relative to the support 312. A threaded groove is formed in the circumferential surface of the bolt portion 3151.

A through hole 211 extending through the conductor plate 21 in the thickness direction thereof is formed in one end portion of the conductor plate 21, and the end portion of the conductor plate 21 and the conductor 313 come into contact with each other as a result of the bolt portion 3151 being inserted into the through hole 211. In this state, the nut 3152 is threadably engaged with the bolt portion 3151, thus fastening the conductor plate 21 to the conductor 313. Consequently, one end of the conductor plate 21 is fixed to the coupling member 31.

The conductor 314 is provided with the fixing portion 316. The fixing portion 316 fixes the conductor plate 22 to the conductor 314. The fixing portion 316 includes a bolt portion 3161 and a nut 3162. The bolt portion 3161 is provided upright on the conductor 314. The bolt portion 3161 has a substantially columnar shape, and extends from the conductor 314 toward the opposite side relative to the support 312. A threaded groove is formed in the circumferential surface of the bolt portion 3161.

A through hole 221 extending through the conductor plate 22 in the thickness direction thereof is formed in one end portion of the conductor plate 22, and the end portion of the conductor plate 22 and the conductor 314 come into contact with each other as a result of the bolt portion 3161 being inserted into the through hole 221. In this state, the nut 3162 is threadably engaged with the bolt portion 3161, thus fastening the conductor plate 22 to the conductor 314. Consequently, one end of the conductor plate 22 is fixed to the coupling member 31.

With such a coupling member 31, it is possible to mechanically couple the conductor plates 21 and 22, while electrically connecting the conductor plates 21 and 22 via the conductors 313 and 314 and the overcurrent protection portion 311.

Note that the bolt portion 3151 may be a member separate from the conductor 313. The bolt portion 3151 may be a bolt including a head portion, and a columnar portion having a threaded groove formed in the circumferential surface thereof. In this case, the bolt portion 3151 extends through the conductor 313 in the thickness direction thereof. The same applies to the bolt portion 3161.

Referring to FIG. 1, the conductor plate 23 is connected to the conductor plate 22 via the coupling member 32, for example. Accordingly, the conductor plate 23 is connected to the conductor plate 21 via the conductor plate 22. The coupling member 32 mechanically couples the conductor plates 22 and 23, while electrically connecting the conductor plates 22 and 23. For example, the other end of the conductor plate 22 in the longitudinal direction is coupled to the coupling member 32, and one end of the conductor plate 23 in the longitudinal direction is coupled to the coupling member 32.

The coupling member 32 may include an overcurrent protection portion 321. The overcurrent protection portion 321 is interposed between the conductor plates 22 and 23, and is rendered non-conductive by a current that exceeds a predetermined allowable current (hereinafter referred to as a "second allowable current") flowing therethrough. The overcurrent protection portion 321 may be a fuse, for example. An example of the specific configuration of the coupling member 32 is the same as that of the coupling member 31, and, therefore, redundant description thereof is omitted.

The electricity storage device 1 is a battery (e.g., a lead battery or a lithium ion battery) or a capacitor. The electricity storage device 1 is connected to the conductor plate 21 via a wire 40, for example. For example, the wire 40 is the so-called electric wire, and can be provided in wire harnesses. The method for connecting one end of the wire 40 to the conductor plate 21 is not particularly limited. In short, a conductor portion (e.g., a core wire or a terminal) on one end side of the wire 40 is fixed to a portion of the conductor plate 21 while being brought into contact therewith. The fixation may be performed by any suitable method. For example, it is possible to use a fixing method using a screw, solder, a conductive adhesive, or the like.

In the power supply system, the conductor plate 22 is connected to the electricity storage device 1 via the coupling member 31, the conductor plate 21, and the wire 40 in that order, and the conductor plate 23 is connected to the electricity storage device 1 via the coupling member 32, the conductor plate 22, the coupling member 31, the conductor plate 21, and the wire 40 in that order. That is, in the power supply system of the present embodiment, the conductor plates are disposed such that the cross-sectional area of the conductor plate decreases as the distance from the electricity storage device 1 increases.

In the example shown in FIG. 1, the conductor plate 21 is connected to loads 51 and 52 via wires 41 and 42 respectively, the conductor plate 22 is connected to a load 53 via a wire 43, and the conductor plate 23 is connected to a load 54 via a wire 44. The wires 41 and 42 can be regarded as wires (here, referred to as a "branched wire") that are branched from the conductor plate 21. Similarly, the wire 43 can be regarded as a branched wire that is branched from the conductor plate 22, and the wire 44 can be regarded as a branched wire that is branched from the conductor plate 23. For example, the branched wires 41 to 44 are the so-called electric wires, and can be provided in wire harnesses.

The connection between one end of each of the branched wires 41 and 42 and the conductor plate 21, the connection between one end of the branched wire 43 and the conductor plate 22, and the connection between one end of the branched wire 44 and the conductor plate 23 can be achieved in the same manner as in the case of the connection between the wire 40 and the conductor plate 21. However, modifications thereof will be described later.

Each of the loads 51 to 54 is an electric device provided in a vehicle, and may be an electric device such as an electronic control unit (ECU) including a control circuit, an electric motor for power-steering, an electric motor for closing/opening doors, various types of sensors, a car navigation system, and an air conditioner.

In such a power supply system, currents i1 and i2 respectively flowing to the loads 51 and 52 via the branched wires 41 and 42 flow through the conductor plate 21, but not through the conductor plates 22 and 23. A current i3 flowing to the load 53 via the branched wire 43 flows through the conductor plates 21 and 22, but not through the conductor plate 23. A current i4 flowing to the load 54 via the branched wire 44 flows through all the conductor plates 21 to 23. That is, all the currents i1 to i4 flow through the conductor plate 21, the currents i3 and i4 flow through the conductor plate 22, and the current i4 flows through the conductor plate 23. Accordingly, the maximum value of the current flowing through the conductor plate 21 is larger than the maximum value of the current flowing through the conductor plate 22, and the maximum value of the current flowing through the conductor plate 22 is larger than the maximum value of the current flowing through the conductor plate 23. Note that in the example shown in FIG. 1, the flow of the currents is indicated by the dashed line. The magnitude relationship between the currents flowing through the conductor plates 21 to 23 is indicated by the thickness of the dashed line.

For example, it is assumed that the currents i1 and i2 flowing through the loads 51 and 52 are each 50 [A], and the currents i3 and i4 flowing through the loads 53 and 54 are 30 [A] and 20 [A], respectively. In this case, a maximum current of 150 (=2×50+30+20) [A] flows through the conductor plate 21, a maximum current of 50 (=30+20) [A] flows through the conductor plate 22, and a maximum current of 20 [A] flows through the conductor plate 23.

Meanwhile, the current capacities (or the allowable currents; the same applied to the following description) of the respective conductor plates 21 to 23 are dependent on the cross-sectional areas of the respective conductor plates 21 to 23. Specifically, the larger the cross-sectional area, the higher the current capacity is. Therefore, the cross-sectional areas corresponding to the currents flowing through the respective conductor plates 21 to 23 can be set for the conductor plates 21 to 23.

In the present embodiment, the cross-sectional area of the conductor plate 21 through which the largest current flows is set to have the largest value (e.g., 15 [sq]), the cross-sectional area of the conductor plate 22 through which the second largest current flows is set to have the second largest value (e.g., 10 [sq]), and the cross-sectional area of the conductor plate 23, through which the smallest current flows, is set to have the smallest value (e.g., 8 [sq]).

As a comparative example, a case will be considered where the conductor plates 22 and 23 are configured to have the same cross-sectional area as the cross-sectional area of the conductor plate 21 through which the largest current flows, for example. Even in this case, no problem will arise in terms of the current capacity. However, since the cross-sectional areas of the conductor plates 22 and 23, and hence the respective volumes thereof, are unduly large, the conductor plates 22 and 23 are unduly heavy.

According to the present embodiment, it is possible to reduce the volumes of the conductor plates 22 and 23, while achieving the current capacities corresponding to the currents to be borne, as compared with the comparative example. Accordingly, it is possible to reduce the weights of the conductor plates 22 and 23 while appropriately supplying power. This can improve the fuel efficiency of the vehicle. In addition, owing to the reduction in the volumes of the conductor plates 22 and 23, it is possible to reduce the material costs of the conductor plates 22 and 23, thus reducing the manufacturing cost.

Width of Conductor Plate

In the above-described example, the width W3 of the conductor plate 23 is set to be smaller than the width W2 of the conductor plate 22, and the width W2 of the conductor plate 22 is set to be smaller than the width W1 of the conductor plate 21. This can establish the above-described magnitude relationship between the cross-sectional areas even when the thicknesses of the conductor plates 21 to 23 are set be comparable. Accordingly, it is possible to form the conductor plates 21 to 23 by cutting out conductive plate materials with comparable thicknesses. This contributes to the reduction of manufacturing costs.

The conductor plates 21 to 23 may extend inside the vehicle, while being bent. For example, the conductor plates 21 to 23 may be bent in the thickness direction thereof. When the thicknesses of the conductor plates 21 to 23 are comparable, the degrees of bendability of the conductor plates 21 to 23 are comparable. Therefore, the conductor plates 21 to 23 can be bent with comparable forces, without distinction therebetween. On one hand, when, for example, only the conductor plate 21 has a large thickness, it is more difficult to bend the conductor plate 21 than the conductor plates 22 and 23. Such a difference in the degree of bendability makes it more difficult for the operator to perform the operations. On the other hand, when the conductor plates 21 to 23 have comparable thicknesses, the conductor plates 21 to 23 can be bent with comparable forces, thus making it possible to improve the operability.

Allowable Current of Overcurrent Protection Portion

The first allowable current of the overcurrent protection portion 311 is set to have a value (e.g., 80 [A]) slightly larger than the value (e.g., 50 [A]) of the current flowing through the conductor plate 22 when the loads 53 and 54 are in the normal state. This makes it possible to appropriately protect the conductor plate 22 and the load 53.

Since the cross-sectional area of the conductor plate 23 is smaller than the cross-sectional area of the conductor plate 22, the current capacity of the conductor plate 23 is smaller than the current capacity of the conductor plate 22. Accordingly, the second allowable current of the overcurrent protection portion 321 is set to be smaller than the first allowable current of the overcurrent protection portion 311.

For example, the second allowable current is set to have a value (e.g., 30 [A]) that is slightly smaller than the value of the first allowable current, and is slightly larger than the value (e.g., 20 [A]) of the current flowing through the conductor plate 23 when the load 54 is in the normal state.

Accordingly, the overcurrent protection portion 321 is rendered non-conductive by the second allowable current smaller than the first allowable current for the conductor plate 23 having a smaller current capacity than the conductor plate 22. This makes it possible to appropriately protect the conductor plate 23 and the load 54.

Note that the electricity storage device 1 may be provided with an overcurrent protection portion (e.g., a fuse), which is not shown. The allowable current (hereinafter referred to as a "third allowable current") of this overcurrent protection portion is set to be larger than the first allowable current. For example, the third allowable current is set to have a value (e.g., 160 [A]) slightly larger than the value (e.g., 150 [A]) of the current flowing through the conductor plate 21 when the loads 51 to 54 are in their normal state. This makes it possible to appropriately protect the conductor plate 21 and the loads 51 and 52.

In the above-described example, the overcurrent protection portions 311 and 321 are provided on the coupling members 31 and 32, respectively. Accordingly, the overcurrent protection portions 311 and 321 can be connected to proper positions by the operator appropriately attaching the coupling members 31 and 32 to the conductor plates 21 to 23. That is, the operator can easily set the overcurrent protection portion 311 between the conductor plates 21 and 22, and can also easily set the overcurrent protection portion 321 between the conductor plates 22 and 23.

Modifications

Although the three conductor plates 21 to 23 are provided in the example shown in FIG. 1, two or more conductor plates may be provided. In this case, the number of coupling members provided is smaller than the number of conductor plates by one.

Although the four loads 51 to 54 are provided in the example shown in FIG. 1, at least one load may be provided for each of the conductor plates 21 to 23.

In the example shown in FIG. 1, the widths W1 to W3 of the conductor plates 21 to 23 are set to be different from each other, thus establishing the above-described magnitude relationship between the cross-sectional areas. However, the present disclosure is not necessarily limited thereto. For example, the thicknesses of the conductor plates 21 to 23 may be set to be different from each other. More specifically, the thickness of the conductor plate 21 may be set to be the largest, the thickness of the conductor plate 22 may be set to be smaller than the thickness of the conductor plate 21, and the thickness of the conductor plate 23 may be set to be the smallest. The reason is that this can also contribute to establishing the above-described magnitude relationship between the cross-sectional areas.

Since the currents i1 and i2 do not flow through the coupling member 31, the cross-sectional areas of the conductors 313 and 314 of the coupling member 31 may be smaller than the cross-sectional area of the conductor plate 21, as long as it is greater than or equal to the cross-sectional area of the conductor plate 22.

In the above-described example, current flows from the electricity storage device 1 to each of the loads 51 to 54. That is, the description has been given for a case where the conductor plate 21 is connected to the output end on the high-potential side of the electricity storage device 1. However, the conductor plate 21 may be connected to the output end on the low-potential side of the electricity storage device 1. In this case, the conductor plates 21 to 23 can each serve as the so-called ground.

Figure 3:
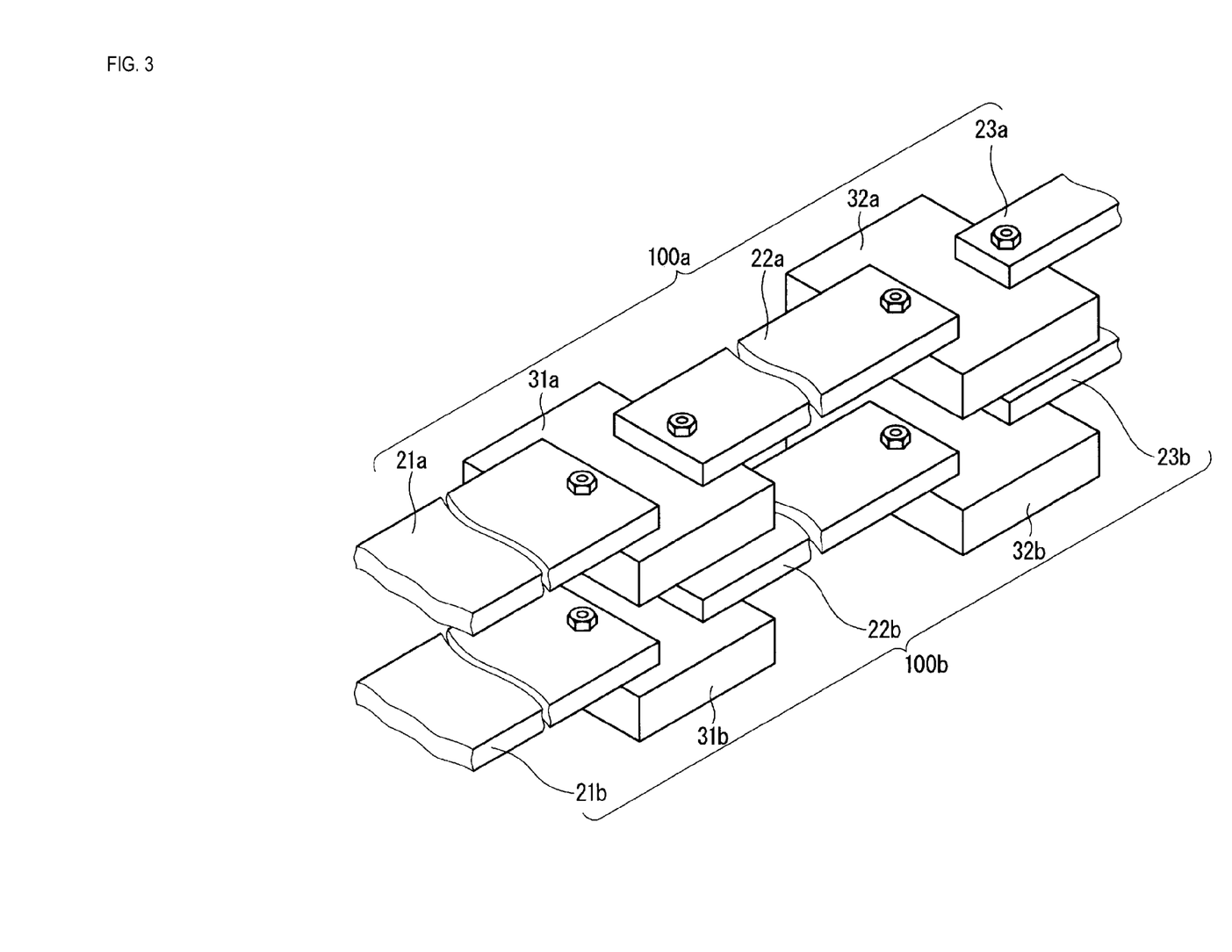
FIG. 3 is a perspective view showing an exemplary arrangement of two wiring modules.

FIG. 3 is a perspective view showing an exemplary arrangement of wiring modules 100a and 100b. A wiring module 100a including high-potential conductor plates 21a to 23a and coupling members 31a and 32a of an electricity storage device 1, and a wiring module 100b including low-potential conductor plates 21b to 23b and coupling members 31b and 32b of the electricity storage device 1 are both provided. The conductor plates 21a to 23a and the coupling members 31a and 32a are configured in the same manner as the conductor plates 21 to 23 and the coupling members 31 and 32, respectively, of the wiring module 100, and the conductor plates 21b to 23b and the coupling members 31b and 32b are configured in the same manner as the conductor plates 21 to 23 and the coupling members 31 and 32, respectively, of the wiring module 100. In this case, as shown in FIG. 3, the conductor plates 21a to 23a and the conductor plates 21b to 23b may be disposed overlapping with each other in the thickness direction.

To avoid complicating the drawings, the coupling members 31a, 32a, 31b, and 32b are schematically shown in FIG. 3, and the configuration corresponding to the overcurrent protection portion 311 shown in FIG. 2 is omitted, for example. In addition, the conductor plates 21a to 23a and 21b to 23b are shown partly broken away.

Although one electricity storage device 1 is provided in the example shown in FIG. 1, a plurality of electricity storage devices 1 may be provided. For example, each of the plurality of electricity storage devices 1 is connected to the conductor plate 21 via a wire.

Figure 4:
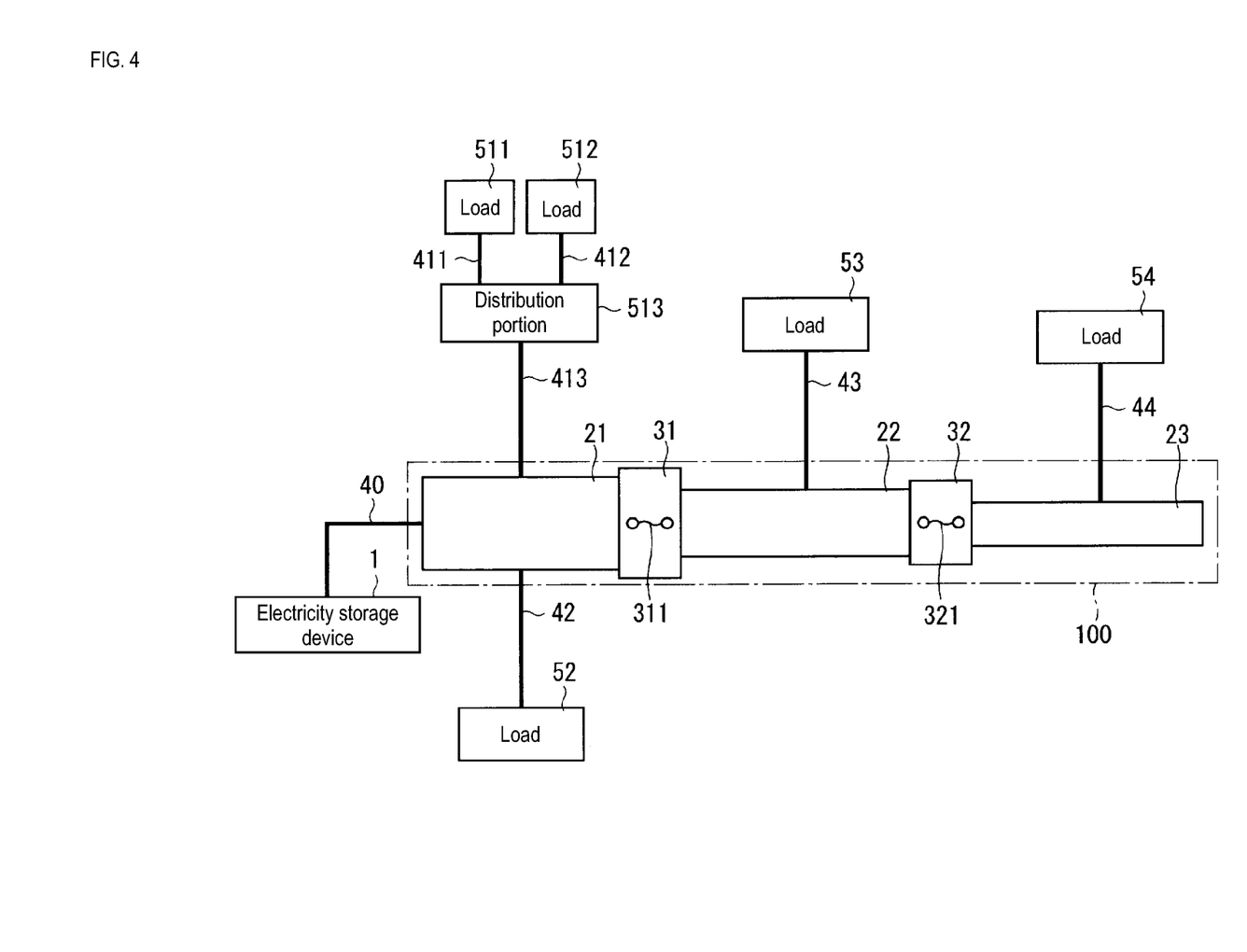
FIG. 4 is a diagram schematically showing another example of the configuration of a vehicle-mounted power supply system.

In the example shown in FIG. 1, the loads 51 to 54 are appropriately connected to the conductor plates 21 to 23 via the wires 41 to 44, respectively. However, a plurality of loads may be connected to a conductor plate via a distribution portion. FIG. 4 is a diagram schematically showing another example of the configuration of a vehicle-mounted power supply system. The power supply system shown in FIG. 4 is different from the power supply system shown in FIG. 1 in that loads 511 and 512 and a distribution portion 513 are provided in place of the load 51. The distribution portion 513 is connected to the conductor plate 21 via a wire 413, and is also connected to loads 511 and 512 via wires 411 and 412, respectively. An example of the loads 511 and 512 is as described above. The wires 411 to 413 may be, for example, electrical wires, and can be provided in wire harnesses. The distribution portion 513 is a member that electrically connects the wires 411 to 413 to each other. The distribution portion 513 includes a conductor that connects the wires 411 to 413 to each other, and may be provided with an overcurrent protection portion or a relay as needed.

Figure 5:
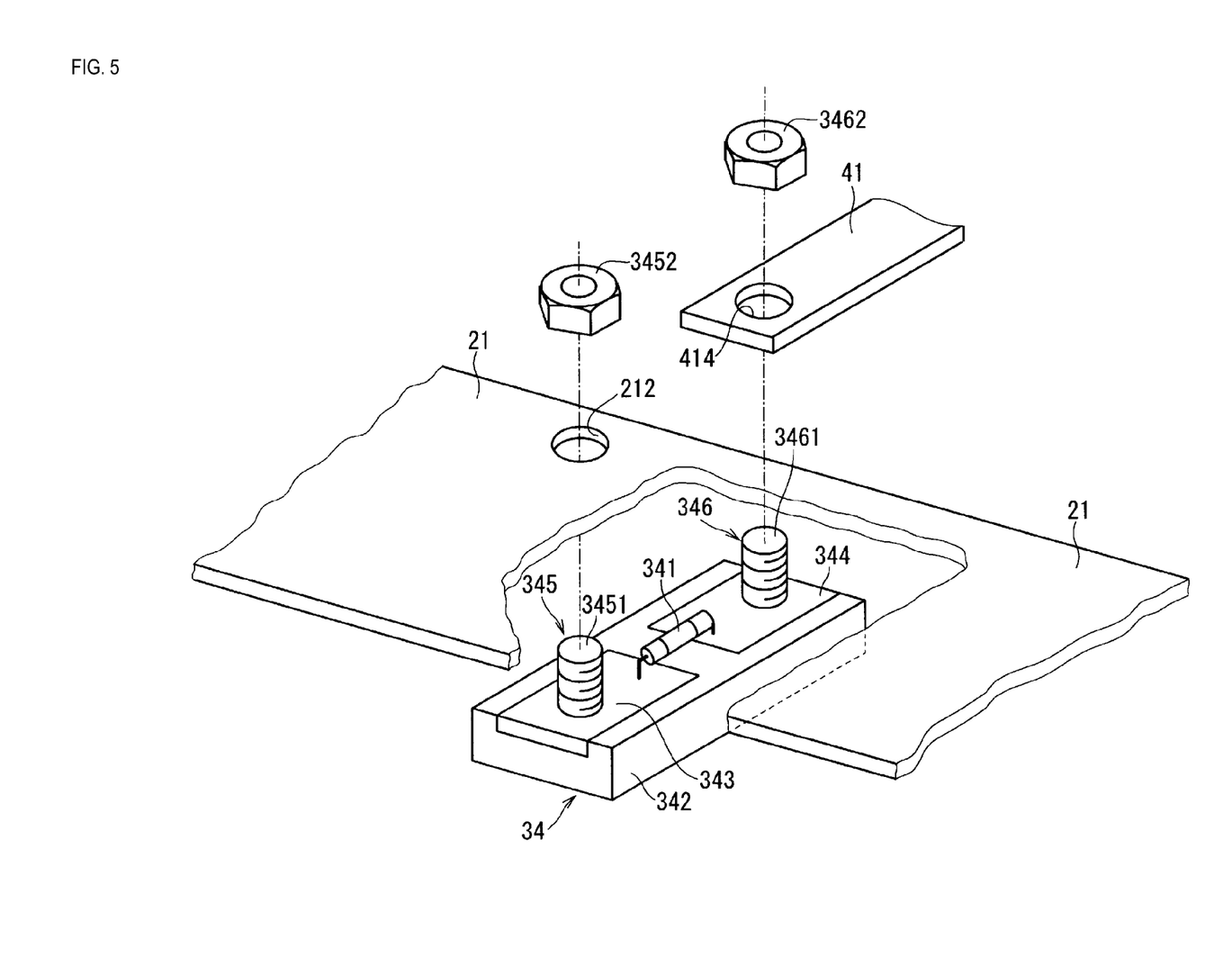
FIG. 5 is an exploded perspective view showing an exemplary connection between a branched wire and a conductor plate.

The branched wire may also be a flat conductor. FIG. 5 is an exploded perspective view of a branched wire 41 that is a flat conductor, showing, in enlargement, a portion where one end of the conductor and the conductor plate 21 are connected. For example, for the connection at the above-described portion, a coupling member 34 may be used in the same manner as in the case where the conductor plates 21 and 22 are connected to each other by the coupling member 31. In this case, it can be said that the branched wire 41 is branched from the conductor plate 21 by the coupling member 34. In FIG. 5, to facilitate viewing, the conductor plate 21 is shown partly broken.

The coupling member 34 includes a support 342, conductors 343 and 344, an overcurrent protection portion 341, fixing portions 345 and 346, bolt portions 3451 and 3461, and nuts 3452 and 3462 that correspond to the support 312, the conductors 313 and 314, the overcurrent protection portion 311, the fixing portions 315 and 316, the bolt portions 3151 and 3161, and the nuts 3152 and 3162, respectively, of the coupling member 31.

A through hole 212 extending through the conductor plate 21 in the thickness direction thereof is formed in an end portion of the conductor plate 21 in the width direction thereof, and the end portion of the conductor plate 21 in the width direction and the conductor 343 come into contact with each other as a result of the bolt portion 3451 being inserted into the through hole 212. In this state, the nut 3452 is threadably engaged with the bolt portion 3451, thus fastening the conductor plate 21 to the conductor 343. Consequently, the end portion of the conductor plate 21 in the width direction is fixed to the coupling member 34.

A through hole 414 extending through the branched wire 41 in the thickness direction is formed in an end portion of the branched wire 41 in the longitudinal direction thereof, and the end portion of the branched wire 41 in the longitudinal direction and the conductor 344 come into contact with each other as a result of the bolt portion 3461 being inserted into the through hole 414. In this state, the nut 3462 is threadably engaged with the bolt portion 3461, thus fastening the branched wire 41 to the conductor 344. Consequently, the end portion of the branched wire 41 in the longitudinal direction is fixed to the coupling member 34.

With the coupling member 34, it is possible to mechanically couple the conductor plate 21 and the branched wire 41, while electrically connecting the conductor plate 21 and the branched wire 41 via the conductors 343 and 344 and the overcurrent protection portion 341. The mechanical coupling and the electrical connection between the conductor plate 21 and the branched wire 42, between the conductor plate 22 and the branched wire 43, and between the conductor plate 23 and the branched wire 44 all can be achieved in the same manner as in the case of the conductor plate 21 and the branched wire 41.

Figure 6:
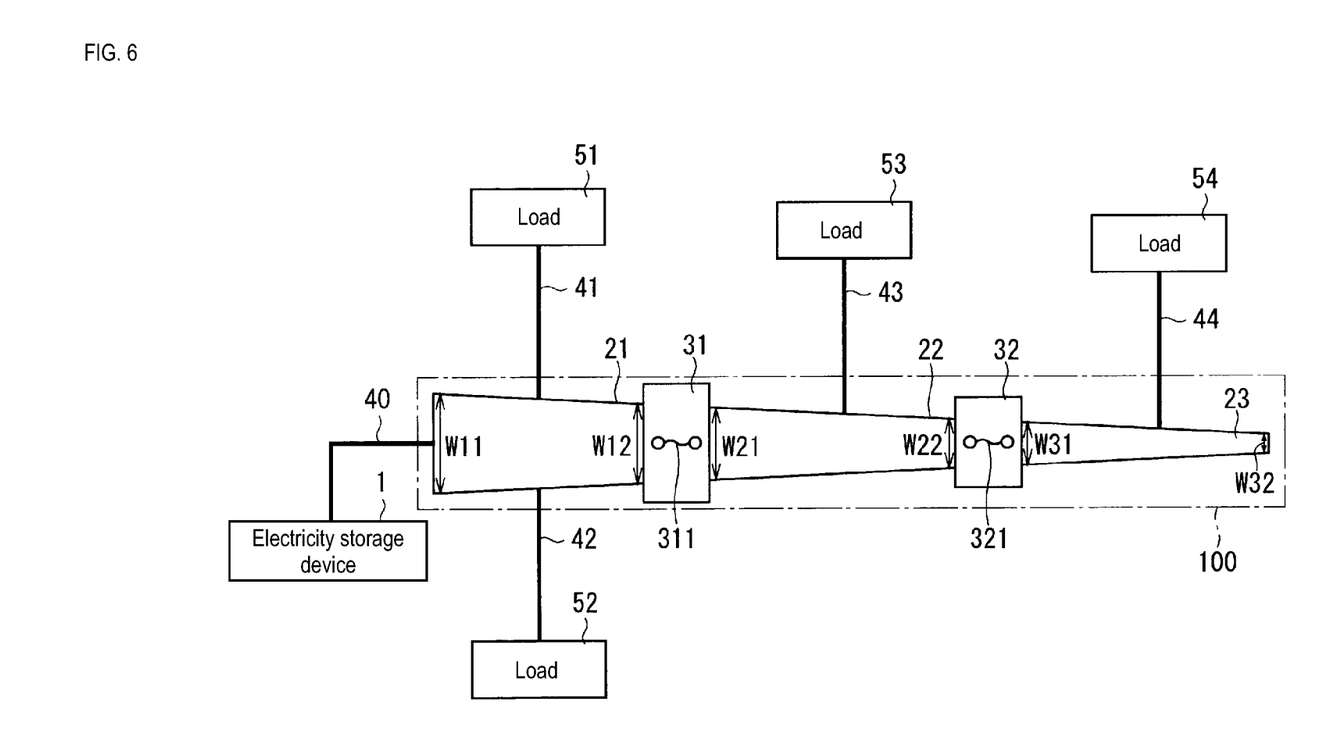
FIG. 6 is a diagram schematically showing yet another example of the configuration of a vehicle-mounted power supply system.

The dimensions of the conductor plates 21 to 23 in the width direction do not need to be constant in the longitudinal direction thereof. FIG. 6 schematically shows yet another example of the configuration of a vehicle-mounted power supply system. The configuration shown in FIG. 6 is different from the configuration shown in FIG. 1 only in the dimensions, in the width direction, of the conductor plates 21 to 23 included in the wiring module 100.

Specifically, the conductor plate 21 has a width W11 and a width W12 at its end on the wire 40 side and its end on the coupling member 31 side, respectively. The conductor plate 22 has a width W21 and a width W22 at its end on the coupling member 31 side and its end on the coupling member 32 side, respectively. The conductor plate 23 has a width W31 and a width W32 at its end on the coupling member 32 side and its end on the side opposite to the coupling member 32. Then, the relationship: W11>W12≥W21≥W22≥W31>W32 holds between these widths. In such a case as well, it can be said that, on the average, the cross-sectional width of the conductor plate 22 is smaller than the cross-sectional width of the conductor plate 21, and the cross-sectional width of the conductor plate 23 is smaller than the cross-sectional width of the conductor plate 22.

The configurations described in the embodiments and the modifications may be combined as appropriate as long as there are no mutual inconsistencies.

Although the wiring module according to the present disclosure has been described in detail above, the foregoing description is illustrative in all aspects and the wiring module is not limited thereto. It will be appreciated that numerous modifications not illustrated herein can be made without departing from the scope of the wiring module. For example, a ground wire (e.g., an electric wire) may be overlapped with the conductor plates 21 to 23.

The invention claimed is:

1. A vehicle-mounted wiring module that supplies power from an electricity storage device to an electric device, the wiring module comprising:
    a first conductor plate that has a first cross-sectional area and is formed from a flat conductor;
    a second conductor plate that has a second cross-sectional area smaller than the first cross-sectional area is, spaced apart from the first conductor plate and is formed from a flat conductor; and
    a conductive first coupling member that couples the first conductor plate and the second conductor plate to each other, the first coupling member includes a first support made of an insulating material and a first conductor and second conductor spaced apart from each other and seated within the first support so as to be electrically insulated from each other and a conductive first overcurrent protection portion interconnecting the first conductor to the second conductor.

2. The wiring module according to claim 1,
    wherein the second conductor plate has a cross-sectional width smaller than a cross-sectional width of the first conductor plate.

3. The wiring module according to claim 2,
    wherein the first overcurrent protection portion is rendered non-conductive by a current that exceeds a first allowable current flowing therethrough.

4. The wiring module according to claim 2, further comprising:
    a wire that is branched from the first conductor plate.

5. The wiring module according to claim 1,
    wherein the second conductor plate has a thickness smaller than a thickness of the first conductor plate.

6. The wiring module according to claim 5,
    wherein the first overcurrent protection portion is rendered non-conductive by a current that exceeds a first allowable current flowing therethrough.

7. The wiring module according to claim 5, further comprising:
    a wire that is branched from the first conductor plate.

8. The wiring module according to claim 1,
    wherein the first overcurrent protection portion is rendered non-conductive by a current that exceeds a first allowable current flowing therethrough.

9. The wiring module according to claim 8, further comprising:
    a flat third conductor plate that has a third cross-sectional area smaller than the second cross-sectional area, and is to be connected to the first conductor plate via the second conductor plate; and
    a conductive second coupling member that couples the second conductor plate and the third conductor plate to each other,
    wherein the second coupling member includes a second support made of an insulating material and a third conductor and fourth conductor spaced apart from each other and seated within the second support so as to be electrically insulated from each other and a conductive second overcurrent protection portion interconnecting the third conductor to the fourth conductor, and
    the second overcurrent protection portion is rendered non-conductive by a current that exceeds a second allowable current smaller than the first allowable current flowing therethrough.

10. The wiring module according to claim 8,
    wherein the first coupling member includes:
    a first fixing portion extending through the first conductor; and
    a second fixing portion extending through the second conductor, and
    the first conductor plate and the first conductor are fixed by the first fixing portion, and the second conductor plate and the second conductor are fixed by the second fixing portion.

11. The wiring module according to claim 10, wherein the first fixing portion and the second fixing portion are a bolt and a nut, respectively.

12. The wiring module according to claim 8, further comprising:
    a wire that is branched from the first conductor plate.

13. The wiring module according to claim 1, further comprising:
    a wire that is branched from the first conductor plate.

14. The wiring module according to claim 13, wherein the wire is a flat conductor.

* * * * *